United States Patent
Kraus

(10) Patent No.: US 9,083,345 B2
(45) Date of Patent: Jul. 14, 2015

(54) CIRCUIT ARRANGEMENT FOR DETERMINING A CAPACITANCE OF A NUMBER OF CAPACITIVE SENSOR ELEMENTS

(75) Inventor: Randolf Kraus, Bretten (DE)

(73) Assignee: E.G.O. Elektro-Gerätebau GmbH, Oberderdingen (DE)

(*) Notice: Subject to any disclaimer, the term of this patent is extended or adjusted under 35 U.S.C. 154(b) by 236 days.

(21) Appl. No.: 13/575,678

(22) PCT Filed: Jan. 24, 2011

(86) PCT No.: PCT/EP2011/050889
§ 371 (c)(1),
(2), (4) Date: Jul. 27, 2012

(87) PCT Pub. No.: WO2011/092134
PCT Pub. Date: Aug. 4, 2011

(65) Prior Publication Data
US 2012/0286809 A1    Nov. 15, 2012

(30) Foreign Application Priority Data
Jan. 29, 2010   (DE) .......... 10 2010 001 377

(51) Int. Cl.
*G01R 27/26*    (2006.01)
*H03K 17/96*    (2006.01)
*H03K 17/00*    (2006.01)

(52) U.S. Cl.
CPC .......... *H03K 17/9622* (2013.01); *H03K 17/002* (2013.01); *H03K 2217/96074* (2013.01); *H03K 2217/960725* (2013.01)

(58) Field of Classification Search
CPC ............. G01R 27/2605; G01R 31/028; G01R 31/2887; G01R 31/2831; G01R 31/312; G01R 31/08; G01R 31/2805; G01R 31/06794; G01D 5/24; G06K 9/0002; H03K 17/962; H03K 17/955

USPC ............... 324/750.17, 754.28, 519, 658–690; 178/18.01; 340/407.2
See application file for complete search history.

(56) References Cited

U.S. PATENT DOCUMENTS 4,918,454 A * 4/1990 Early et al. ..................... 341/172
5,257,210 A * 10/1993 Schneider et al. ............ 702/109
(Continued)

FOREIGN PATENT DOCUMENTS

WO    WO 99 / 38149  A1    7/1999

OTHER PUBLICATIONS

English Translation of the PCT International Preliminary Report on Patentability dated Sep. 25, 2012 in PCT/EP2011/050889.
(Continued)

*Primary Examiner* — Huy Q Phan
*Assistant Examiner* — Thang Le
(74) *Attorney, Agent, or Firm* — Lee & Hayes, PLLC

(57) ABSTRACT

A circuit arrangement for determining a capacitance of a number n of capacitive sensor elements (SE1~SEn) comprises at least one collecting capacitor (CS1~CSm), a reference voltage source (RQ), an evaluation device (AE) connected to the at least one collecting capacitor to evaluate a voltage present at the at least one collecting capacitor, a control unit (MC) for generating at least one control signal (SS1~SSk), and at least one integrated circuit (IC1~ICm) connected to the reference voltage source, the sensor elements, and the at least one collecting capacitor. The at least one integrated circuit comprises a number k of changeover switches (WS1~WSk) responsive to the at least one control signal to connect the respectively associated sensor element to the reference voltage source in a first switching position, and to the at least one collecting capacitor in a second switching position.

13 Claims, 4 Drawing Sheets

(56) References Cited

U.S. PATENT DOCUMENTS

| | | |
|---|---|---|
| 6,452,514 B1 | 9/2002 | Philipp |
| 8,471,570 B2 * | 6/2013 | Portmann ...................... 324/662 |
| 8,629,686 B2 * | 1/2014 | Philipp et al. ................. 324/684 |
| 2003/0155936 A1 * | 8/2003 | Wang ............................ 324/680 |
| 2005/0134292 A1 * | 6/2005 | Knoedgen ..................... 324/658 |
| 2008/0048997 A1 * | 2/2008 | Gillespie et al. .............. 345/174 |
| 2009/0224776 A1 * | 9/2009 | Keith ............................ 324/686 |
| 2011/0163766 A1 * | 7/2011 | Geaghan ....................... 324/678 |

OTHER PUBLICATIONS

German Office Action dated Aug. 4, 2011 in DE 10 2010 001 377 A1.
Philips Semiconductors Integrated Circuits Data Sheet, 74HC/HCT4053, Triple 2-channel analog multiplexer/demultiplexer, Dec. 1990.
Cypress Technical Reference Manual (TRM) Document No. 001-22219 Rev. *D, Jul. 24, 2009, pp. 1-15, 85, 87-91, 101.
International Search Report dated Apr. 7, 2011 in PCT/EP2011/050889.

* cited by examiner

US 9,083,345 B2

CIRCUIT ARRANGEMENT FOR DETERMINING A CAPACITANCE OF A NUMBER OF CAPACITIVE SENSOR ELEMENTS

PRIORITY CLAIM

This application is the National Stage of, and claims the priority of, PCT patent application PCT/EP2011/050889 filed Jan. 24, 2011, which claims the priority of German patent application DE 10 2010 001 377.3 filed Jan. 29, 2010.

TECHNICAL FIELD

The invention relates to a circuit arrangement for determining a capacitance of a number of capacitive sensor elements.

BACKGROUND

Circuit arrangements for evaluating capacitive proximity switches usually use capacitive sensor elements, the capacitance of which changes on the basis of actuation. This change in capacitance is evaluated in order to determine the actuation state.

In circuit arrangements which operate according to the so-called switched-capacitor principle, a charging voltage is usually applied to the capacitive sensor element via a switching means, as a result of which a particular electrical charge is transferred to the capacitive sensor element on the basis of its capacitance and the charging voltage. After a charging time, the sensor element is disconnected from the charging voltage using the switching means and is connected to a collecting capacitor or a reference capacitor of a known capacitance via a further switching means, as a result of which charge is transferred from the sensor element to the collecting capacitor. The process of charging and subsequent charge reversal is repeated for a predetermined number of cycles, as a result of which the charge of the collecting capacitor reaches a particular value which is determined, inter alia, by the value of the capacitance of the sensor element. The charge or the resulting voltage of the collecting capacitor is consequently a measure of the capacitance of the sensor element to be measured. Evaluating the voltage of the collecting capacitor makes it possible to infer the actuation state of the proximity switch. After the voltage has been evaluated, the collecting capacitor is usually discharged in a defined manner, and a new measurement cycle can follow.

BRIEF SUMMARY

A circuit arrangement provides for determining a capacitance of a number of capacitive sensor elements, the respective capacitance of which changes on the basis of actuation. The circuit arrangement preferably comprises at least one collecting capacitor, a reference voltage source, an evaluation device electrically connected to the at least one collecting capacitor to evaluate a voltage present at the at least one collecting capacitor to determine the capacitance of a respective sensor element, a control unit to generate at least one control signal, and at least one integrated circuit which is electrically connected to the reference voltage source, to the sensor elements, and to the at least one collecting capacitor, and to which the at least one control signal is applied.

The integrated circuit preferably comprises a number of changeover switches, a respective changeover switch being respectively associated with one of the number of sensor elements. A respective changeover switch connects the respectively associated sensor element to the reference voltage source in a first switching position, and connects the respectively associated sensor element to the at least one collecting capacitor in a second switching position. On account of the fact that the changeover switches are bundled in the integrated circuit(s) and the fact that lines are routed to the reference voltage source and to the collecting capacitor(s) predominantly inside the integrated circuits, the number of components required and the layout complexity can be reduced, as a result of which the circuit arrangement can be produced in a more cost-effective manner and is more insensitive to EMC and RF interference in comparison with solutions using discrete switching means or toggle switches.

These and further features can be taken not only from the claims but also from the description and the drawings, in which case the individual features may each be realized individually or in combination in the form of sub-combinations in an embodiment of the invention, and may be realized in other fields and constitute advantageous embodiments which are worthy of protection in themselves and for which protection is claimed here. The division of the application into individual sections and under intermediate headings does not limit the general validity of the statements made therein.

DETAILED DESCRIPTION

Figure 1:
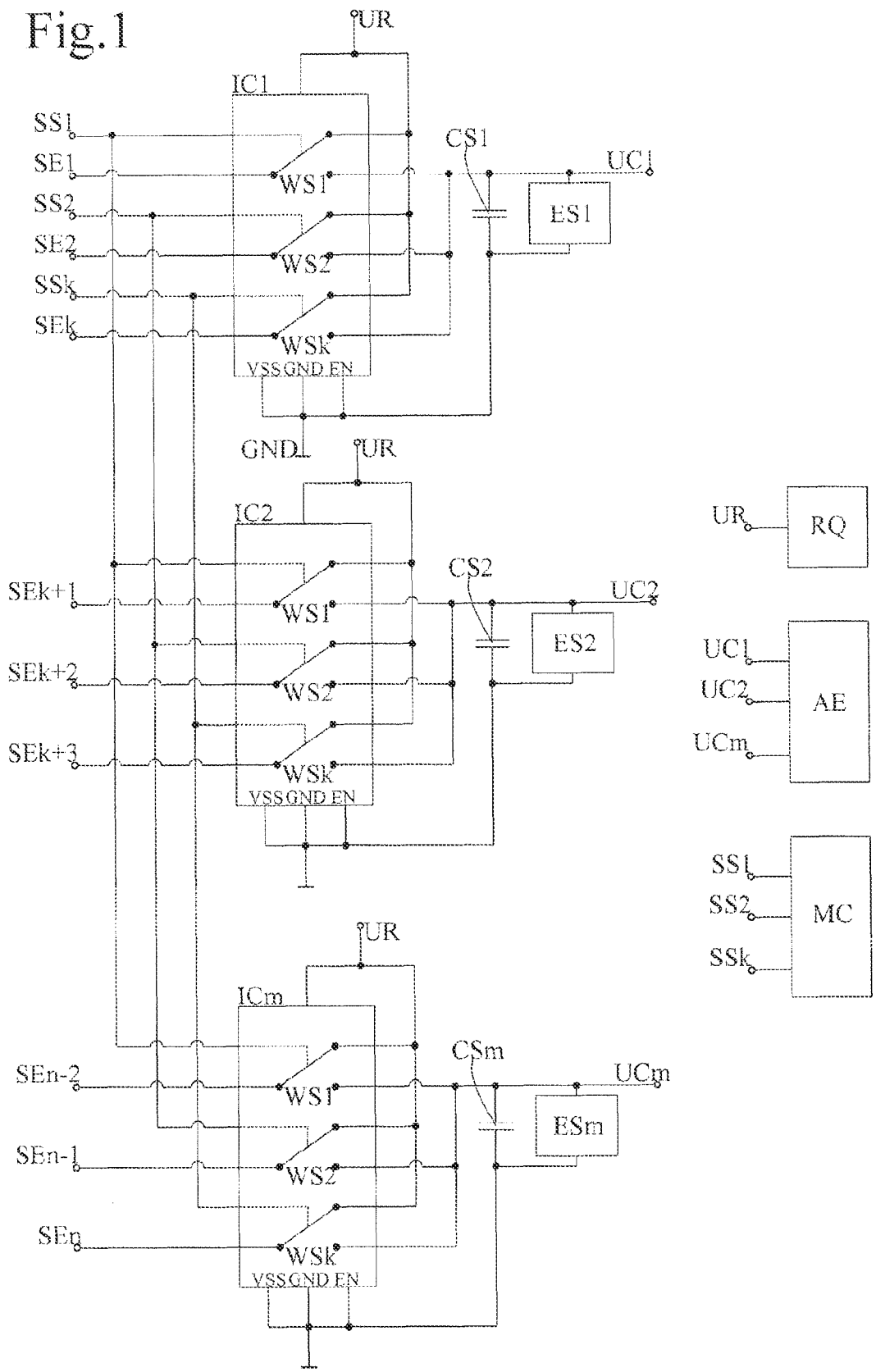
FIG. 1 shows a basic circuit diagram of a first embodiment of a circuit arrangement for determining a capacitance of a number n of capacitive sensor elements.

A circuit arrangement is provided for determining a capacitance of a number of capacitive sensor elements according to the switched-capacitor principle. This circuit arrangement ensures reliable determination of the actuation state in all operating conditions by evaluating the capacitance or the change in capacitance, can be produced in a cost-effective manner, and is insensitive to EMC and RF interference.

The circuit arrangement for determining a capacitance of a number n of capacitive sensor elements, the respective capacitance of which changes on the basis of actuation, comprises at least one collecting capacitor, preferably with a known capacitance, a reference voltage source, in particular for generating a reference voltage or reference potential which is constant over time and can correspond to a supply voltage or a ground potential, an evaluation device, for example a microprocessor with an integrated A/D converter, which is electrically connected to the at least one collecting capacitor and evaluates a voltage present at the at least one collecting capacitor in order to determine the capacitance of a respective sensor element, and a control unit, for example likewise a microprocessor which can likewise form the evaluation device, for generating at least one control signal, and at least one integrated circuit which is electrically connected to the reference voltage source and to the at least one collecting capacitor and to which the at least one control signal is applied.

The at least one integrated circuit comprises a number k of changeover switches, also referred to as a toggle switch, a changeover contact or an analog two-channel multiplexer/demultiplexer, where k is preferably greater than 1, a respective changeover switch being respectively associated with one of the number n of sensor elements, a switching position of a respective changeover switch depending on the at least one control signal, and a respective changeover switch connecting the respectively associated sensor element to the reference voltage source in a first switching position, which corresponds to a charging cycle of the switched-capacitor principle, and the respective changeover switch connecting the respectively associated sensor element to the at least one collecting capacitor in a second switching position for the purpose of charge transfer, which corresponds to a charge transfer cycle of the switched-capacitor principle.

The changeover switches are bundled in the integrated circuit(s), and the lines are routed to the reference voltage source and to the collecting capacitor(s) predominantly inside the integrated circuits, so the number of components required and the layout complexity can be reduced, as a result of which the circuit arrangement can be produced in a more cost-effective manner, and is more insensitive to EMC and RF interference in comparison with solutions using discrete switching means or toggle switches.

In one embodiment, the number n of capacitive sensor elements is an integer multiple of the number of controllable changeover switches in the integrated circuit. For example, the number of controllable changeover switches in a single integrated circuit may be three and a total of four integrated circuits may be used, with the result that a total of n=12=3*4 capacitive sensor elements can be evaluated.

In one embodiment, only one collecting capacitor is respectively associated with each integrated circuit, and a number of different control signals which is equal to the number of changeover switches in a respective integrated circuit is generated. Alternatively, a number of collecting capacitors which is equal to the number of changeover switches in a respective integrated circuit is jointly associated with all integrated circuits, and a number of different control signals which is equal to the number of integrated circuits is generated.

One embodiment provides at least one initialization circuit which is designed to initialize the charge on at least one collecting capacitor before the start of a measurement. The charging circuit may be, for example, in the form of a switching means which connects the collecting capacitor to either a voltage source or a ground reference.

FIG. 1 shows a basic circuit diagram of a first embodiment of a circuit arrangement for determining a capacitance of a number n of capacitive sensor elements SE1 to SEn. The number n may be 12, for example.

The capacitive sensor elements SE1 to SEn each form a capacitor, wherein a first capacitor plate can be formed, in a conventional manner, by a conductive layer (not shown), in particular a flat and two-dimensional layer which may be arranged, for example, below a glass ceramic plate of a hob (not shown). A second capacitor plate is formed, for example, by a finger (not shown) of an operator or by the operator himself. The glass ceramic plate forms a dielectric between the two capacitor plates.

The circuit arrangement comprises a number m of integrated circuits IC1 to ICm, where m is four, for example. The integrated circuits may be of the HCT 4053 type analog multiplexer/demultiplexer, for example. A reference voltage source RQ which provides a reference voltage UR of +5 V DC, for example, is also provided. A control unit MC generates a number k of control signals SS1 to SSk, where k is three, for example.

The integrated circuits IC1 to ICm are each electrically connected to the reference voltage source UR and to associated collecting capacitors CS1 to CSm of a known capacitance, as illustrated. The control signals SS1 to SSk are applied to corresponding inputs of the integrated circuits IC1 to ICm. Inputs Vss, GND and EN of the integrated circuits IC1 to ICm are also connected to ground GND. Furthermore, reference is also made to data books relating to the HCT 4053 type.

The integrated circuits IC1 to ICm each comprise a number k of changeover switches WS1 to WSk, a respective changeover switch WS1 to WSk in the integrated circuits IC1 to ICm respectively being associated with one of the number n of sensor elements SE1 to SEn. A switching position of a respective changeover switch WS1 to WSk depends on the control signals SS1 to SSk. A respective changeover switch WS1 to WSk connects the respectively associated sensor element SE1 to SEn to the reference voltage source UR in a first switching position and connects the respectively associated sensor element SE1 to SEn to the associated collecting capacitor CS1 to CSm in the integrated circuit IC1 to ICm in a second switching position for the purpose of charge transfer.

An evaluation device AE which is electrically connected to the collecting capacitors CS1 to CSm evaluates voltages present at the collecting capacitors CS1 to CSm in order to determine the capacitance of the respective sensor element SE1 to SEn.

Discharge circuits ES1 to ESn are used to discharge the collecting capacitors CS1 to CSm in a defined manner before the start of a measurement. The discharge circuits ES1 to ESn may each be, for example, in the form of switching means which connect the collecting capacitors CS1 to CSm to ground GND for discharging.

A measurement cycle is described by way of example below. At the start of a determination or measurement cycle, the control signals SS1 to SSk are generated in such a manner that all sensor elements SE1 to SEn are connected to the reference voltage source UR. The discharge circuits ES1 to ESn discharge the collecting capacitors CS1 to CSm.

The capacitance of those capacitive sensor elements whose associated changeover switch, here WS1 in each case, is controlled using the control signal SS1 is now first of all determined. For this purpose, the control signal SS1 is generated in the form of a square-wave signal and the control signals SS2 to, or and, SSk remain constant at such a level that causes the associated sensor elements to remain connected to the reference voltage source UR.

The control signal SS1 in the form of a square-wave signal causes charging and then charge reversal cycles to repeatedly take place, as a result of which the collecting capacitors CS1 to CSm are charged in a stepwise manner, a change in voltage per cycle depending on the capacitance of the respective sensor element to be measured. After a predefined number of cycles, the evaluation device AE evaluates a voltage present at the collecting capacitors CS1 to CSm in order to determine the capacitance. Alternatively, it is possible to count a number of charging and charge reversal cycles which is needed to reach or exceed a predefined voltage value at a collecting capacitor. The capacitances of the collecting capacitors CS1 to CSm may be known, for example by means of suitable component selection with predefined capacitance values. However, the capacitances of the collecting capacitors CS1 to CSm need not necessarily be within tight tolerances since calibration is also possible during operation, in which case suitable threshold values which make it possible to distinguish between different capacitance levels can be determined during operation here. In the simplest case, it is necessary to determine only a single threshold value for distinguishing between two different capacitance values, a first capacitance value corresponding to a sensor element which is not actuated and a second capacitance value corresponding to a sensor element which is actuated.

The control signal SS1 is then statically generated again in such a manner that the associated sensor elements are connected to the reference voltage source UR. The discharge circuits ES1 to ESn discharge the collecting capacitors CS1 to CSm.

The capacitance of those capacitive sensor elements whose associated changeover switch, here WS2 in each case, is controlled using the control signal SS2 is then determined. For this purpose, the control signal SS2 is generated in the form of a square-wave signal and the control signals SS1 and SSk remain constant at such a level that causes the associated sensor elements to remain connected to the reference voltage source UR. The capacitance is determined as described above.

The steps mentioned are repeated k times until the capacitance of all sensor elements SE1 to SEn has been determined. The described method then begins anew.

In the embodiment shown in FIG. 1, precisely one collecting capacitor is provided for each integrated circuit IC1 to ICm and is shared between the k inputs of the respective integrated circuit IC1 to ICm using time-division multiplexing. A total of k different control signals SS1 to SSk are required for this purpose.

Figure 2:
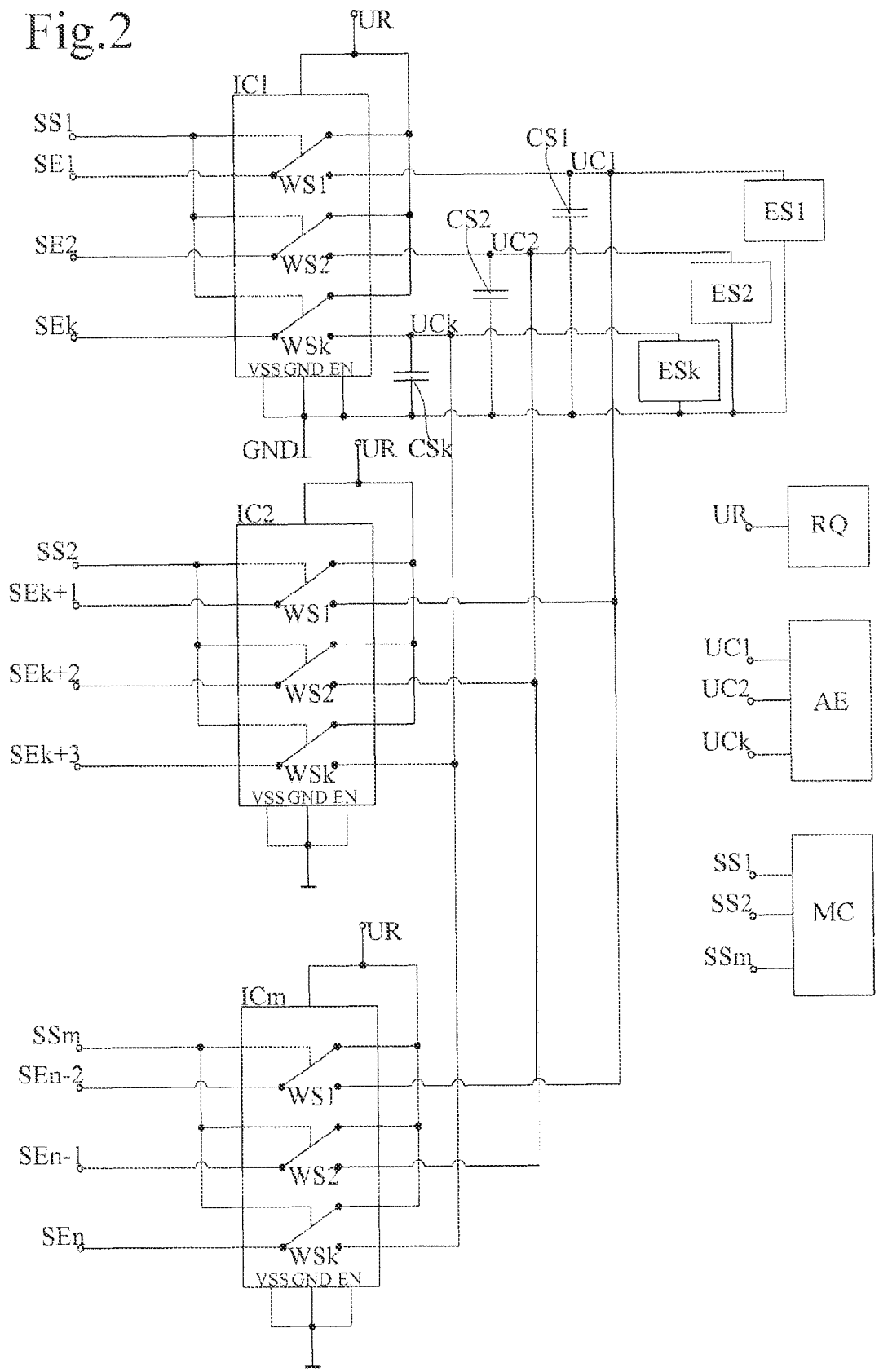
FIG. 2 shows a basic circuit diagram of another embodiment of a circuit arrangement for determining a capacitance of a number n of capacitive sensor elements.

FIG. 2 shows a basic circuit diagram of another embodiment of a circuit arrangement for determining the capacitance of the sensor elements SE1 to SEn, in which all integrated circuits IC1 to ICm share collecting capacitors CS1 to CSk.

For this purpose, a specific control signal SS1 or SSm is generated for each integrated circuit IC1 to ICm, with the result that the integrated circuits IC1 to ICm share the collecting capacitors CS1 to CSk using time-division multiplexing. In other words, the capacitance of the sensor elements SE1 to SEk connected to the first integrated circuit IC1 is first of all determined by generating the sensor signal SS1 in the form of a square-wave signal and generating the remaining sensor signals at such a level that causes the associated sensor elements to remain connected to the reference voltage source UR. The capacitance of the sensor elements connected to the second integrated circuit IC2 is then correspondingly determined etc. After the capacitance of all sensor elements has been determined, the process begins anew.

In the embodiments shown in FIGS. 1 and 2, the reference voltage source generates a positive reference voltage, for example +5 V, and the collecting capacitors are discharged before the start of a measurement.

Figure 3:
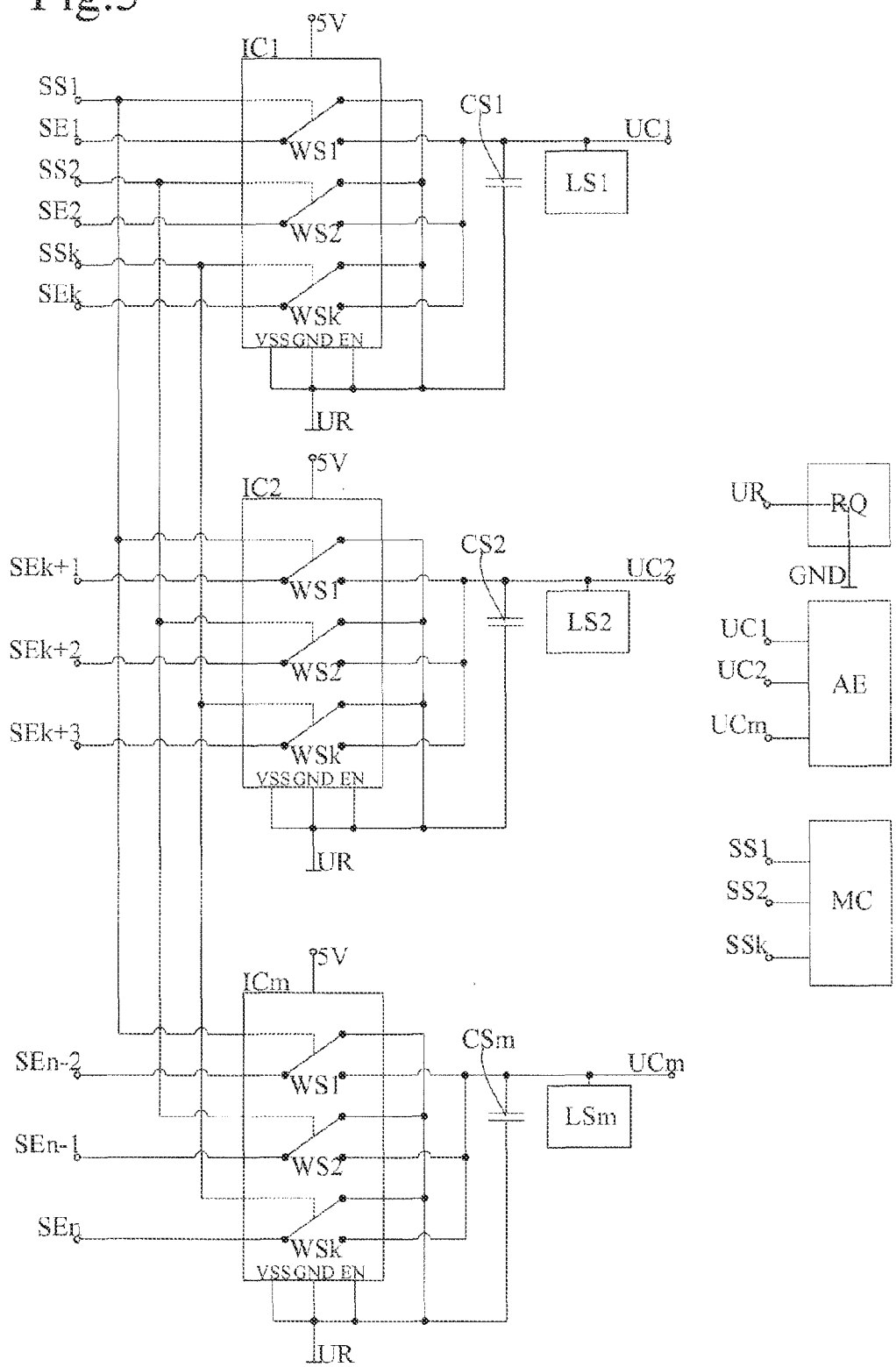
FIG. 3 shows a basic circuit diagram of another embodiment of a circuit arrangement for determining a capacitance of a number n of capacitive sensor elements.
Figure 4:
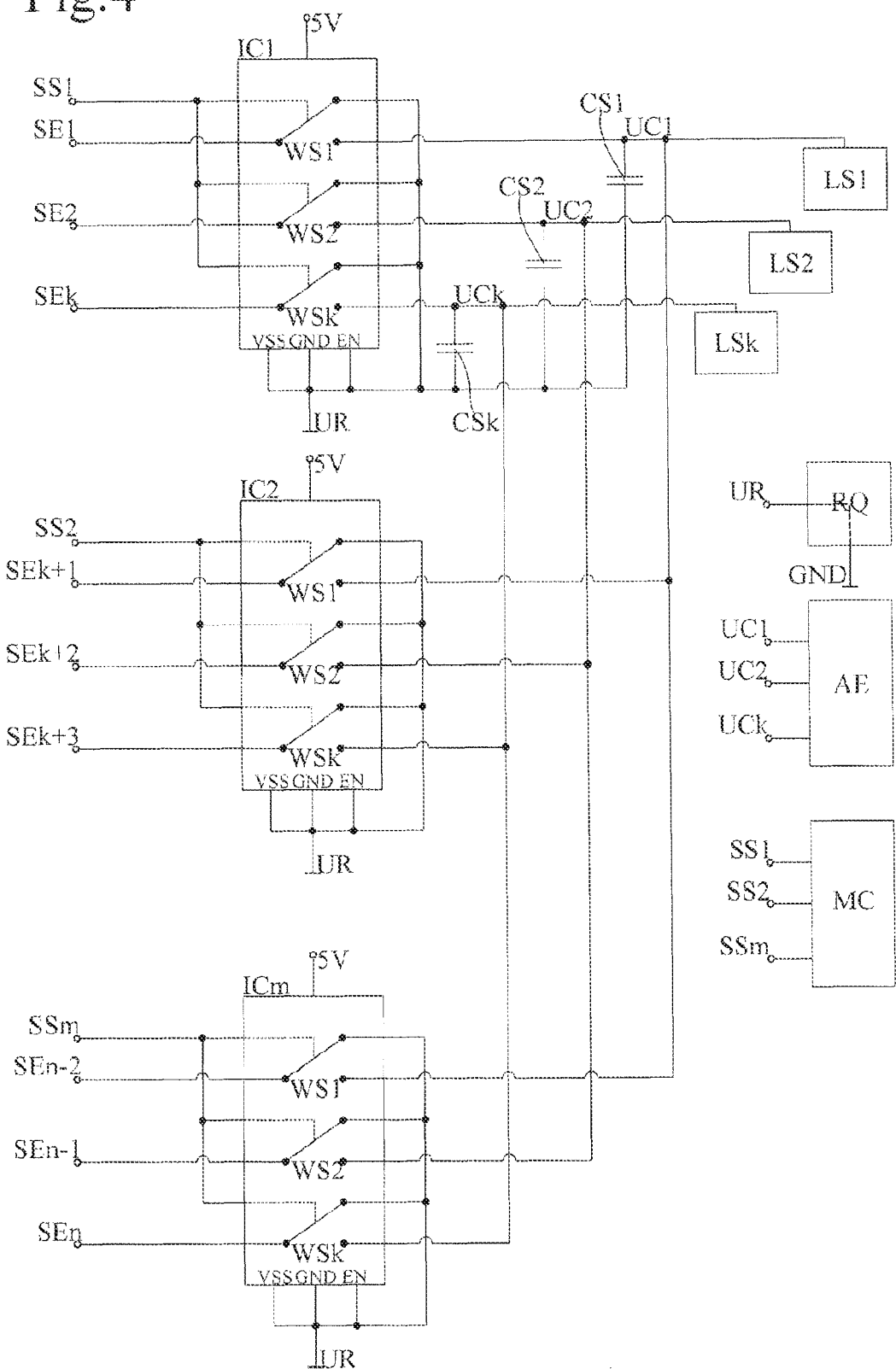
FIG. 4 shows a basic circuit diagram of another embodiment of a circuit arrangement for determining a capacitance of a number n of capacitive sensor elements.

In the embodiments shown in FIGS. 3 and 4, the reference voltage source RQ provides the ground voltage or the ground potential GND, that is to say UR=GND, and the collecting capacitors are charged to a voltage, for example +5 V, using the charging circuits LS1 to LSm or LS1 to LSk before the start of a measurement. If the control signals are generated in the form of square-wave signals, the collecting capacitors are therefore discharged in a stepwise manner by means of the changeover switches. A change or reduction in voltage per cycle depends on the capacitance of the respective sensor element to be measured. After a predefined number of cycles, the evaluation device AE evaluates a voltage present at the collecting capacitors CS1 to CSm or CS1 to CSk in order to determine the capacitance. Alternatively, it is possible to count a number of charging and charge reversal cycles which is needed to reach or fall below a predefined voltage value at a collecting capacitor. For the rest, reference is made to FIGS. 1 and 2.

The evaluation device AE and the control unit MC may be implemented by means of an individual microprocessor.

The embodiments shown ensure reliable determination of the actuation state in all operating conditions, can be produced in a cost-effective manner and are insensitive to EMC and RF interference.

These and further features in the description and the drawings may each be realized individually, in combination, or in the form of sub-combinations.

The subject matter described above is provided by way of illustration only and should not be construed as limiting. Various modifications and changes may be made to the subject matter described herein without following the exemplary embodiments and applications illustrated and described herein.

Although the subject matter presented herein has been described in language specific to the various disclosed embodiments, the appended claims are not necessarily limited to the specific features, acts, or components described herein. Rather, the specific features, acts and components are disclosed as example forms of implementing the claims.

The invention claimed is:

1. A circuit arrangement for determining a capacitance of a plurality of capacitive sensor elements operating according to a switched-capacitor principle, the switched-capacitor principle having a charging cycle and a charge transfer cycle, the circuit comprising:
    at least one collecting capacitor,
    a reference voltage source,
    a control unit for generating a plurality of control signals,
    at least one integrated circuit electrically connected to the reference voltage source, at least one of the plurality of capacitive sensor elements, and to the at least one collecting capacitor and to which the plurality of control signals are applied, the at least one integrated circuit further including
        a plurality of changeover switches,
        a respective changeover switch of the plurality of changeover switches being respectively associated with one of the plurality of capacitive sensor elements,
        a switching position of the respective changeover switch depending on a respective control signal of the plurality of control signals, and
        the respective changeover switch connecting the respectively associated one of the plurality of capacitive sensor elements to the reference voltage source in a first switching position corresponding to the charging cycle, and connecting the respectively associated one of the plurality of capacitive sensor elements to the at least one collecting capacitor in a second switching position corresponding to the charge transfer cycle,
    an evaluation device electrically connected to the at least one collecting capacitor to evaluate a voltage present at the at least one collecting capacitor to determine the capacitance of the respectively associated one of the plurality of capacitive sensor elements; and
    a plurality of said integrated circuits, wherein said plurality of said integrated circuits each have a same number of changeover switches, and wherein a number of the plurality of capacitive sensor elements is an integer multiple of a number of the plurality of controllable changeover switches in one of said plurality of integrated circuits.

2. The circuit arrangement of claim 1, wherein said at least one collecting capacitor is respectively associated with said at least one integrated circuit, and the control unit generates a number of said plurality of control signals which is equal to the number of said plurality of changeover switches in a respective integrated circuit.

3. The circuit arrangement of claim 1, further comprising:
at least one initialization circuit to initialize the charge of the at least one collecting capacitor.

4. The circuit arrangement of claim 3, wherein the at least one initialization circuit charges the at least one collecting capacitor to a voltage above a ground voltage.

5. The circuit arrangement of claim 3, wherein the at least one initialization circuit discharges the at least one collecting capacitor to a ground voltage.

6. A circuit arrangement for determining a capacitance of a plurality of capacitive sensor elements operating according to a switched-capacitor principle, the switched-capacitor principle having a charging cycle and a charge transfer cycle, the circuit comprising:
a plurality of collecting capacitors,
a reference voltage source,
a control unit for generating at least one control signal,
at least one integrated circuit electrically connected to the reference voltage source, at least one of the plurality of capacitive sensor elements, and to the plurality of collecting capacitors, and to which the at least one control signal is applied, the at least one integrated circuit further including
a plurality of changeover switches,
a respective changeover switch of the plurality of changeover switches being respectively associated with one of the plurality of capacitive sensor elements,
a switching position of the respective changeover switch depending on the at least one control signal, and
the respective changeover switch connecting the respectively associated one of the plurality of sensor elements to the reference voltage source in a first switching position corresponding to the charging cycle, and connecting the respectively associated one of the plurality of capacitive sensor elements to a respectively associated one of the plurality of collecting capacitors in a second switching position corresponding to the charge transfer cycle,
an evaluation device electrically connected to the plurality of collecting capacitors to evaluate a voltage present at each of the plurality of collecting capacitors to determine the capacitance of a respective sensor element of the plurality of capacitive sensor elements; and
a plurality of integrated circuits, and wherein, for each of said plurality of integrated circuits, a number of collecting capacitors associated with each of said plurality of integrated circuits is equal to a number of changeover switches in a respective integrated circuit, and wherein the control unit generates a number of said control signals which is equal to a number of said plurality of integrated circuits.

7. The circuit arrangement of claim 6, further comprising:
a plurality of initialization circuits to initialize charges of the plurality of collecting capacitors.

8. The circuit arrangement of claim 7, wherein each of said plurality of initialization circuit charges an associated collecting capacitor to a voltage above a ground voltage.

9. The circuit arrangement of claim 7, wherein each of said plurality of initialization circuit discharges an associated collecting capacitor to a ground voltage.

10. A circuit arrangement for determining a capacitance of a plurality of capacitive sensor elements operating according to a switched-capacitor principle, the switched-capacitor principle having a charging cycle and a charge transfer cycle, the circuit comprising:
a plurality of collecting capacitors,
a reference voltage source,
a control unit for generating at least one control signal,
at least one integrated circuit electrically connected to the reference voltage source, at least one of the plurality of capacitive sensor elements, and to the plurality of collecting capacitors, and to which the at least one control signal is applied, the at least one integrated circuit further including
a plurality of changeover switches,
a respective changeover switch of the plurality of changeover switches being respectively associated with one of the plurality of capacitive sensor elements,
a switching position of the respective changeover switch depending on the at least one control signal, and
the respective changeover switch connecting the respectively associated one of the plurality of sensor elements to the reference voltage source in a first switching position corresponding to the charging cycle, and connecting the respectively associated one of the plurality of capacitive sensor elements to a respectively associated one of the plurality of collecting capacitors in a second switching position corresponding to the charge transfer cycle,
an evaluation device electrically connected to the plurality of collecting capacitors to evaluate a voltage present at each of the plurality of collecting capacitors to determine the capacitance of a respective sensor element of the plurality of capacitive sensor elements, and
a plurality of integrated circuits, wherein said plurality of integrated circuits each have a same number of changeover switches, and wherein a number of capacitive sensor elements is an integer multiple of a number of the plurality of controllable changeover switches in one of said plurality of integrated circuits.

11. The circuit arrangement of claim 10, further comprising:
a plurality of initialization circuits to initialize charges of the plurality of collecting capacitors.

12. The circuit arrangement of claim 11, wherein each of said plurality of initialization circuit charges an associated collecting capacitor to a voltage above a ground voltage.

13. The circuit arrangement of claim 11, wherein each of said plurality of initialization circuit discharges an associated collecting capacitor to a ground voltage.

* * * * *